US010868240B2

(12) United States Patent
Liu et al.

(10) Patent No.: US 10,868,240 B2
(45) Date of Patent: Dec. 15, 2020

(54) ELECTRONIC CIRCUIT STRUCTURE AND METHOD OF FABRICATING ELECTRONIC CIRCUIT STRUCTURE HAVING MAGNETORESISTANCE ELEMENT WITH IMPROVED ELECTRICAL CONTACTS

(71) Applicant: Allegro MicroSystems, LLC, Manchester, NH (US)

(72) Inventors: Yen Ting Liu, Hsinchu (TW); Maxim Klebanov, Manchester, NH (US); Bryan Cadugan, Bedford, NH (US); Sundar Chetlur, Bedford, NH (US); Harianto Wong, Southborough, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/280,199

(22) Filed: Feb. 20, 2019

(65) Prior Publication Data
US 2020/0266337 A1  Aug. 20, 2020

(51) Int. Cl.
*H01L 43/12* (2006.01)
*H01L 43/02* (2006.01)
*H01L 43/08* (2006.01)

(52) U.S. Cl.
CPC ............. *H01L 43/12* (2013.01); *H01L 43/02* (2013.01); *H01L 43/08* (2013.01)

(58) Field of Classification Search
None
See application file for complete search history.

(56) References Cited

U.S. PATENT DOCUMENTS

| 6,473,275 | B1 | 10/2002 | Gill |
| 8,848,320 | B1 | 9/2014 | David et al. |
| 8,885,302 | B1 | 11/2014 | David et al. |
| 2004/0012056 | A1* | 1/2004 | Nejad ..................... G11C 11/15 257/414 |
| 2009/0015252 | A1 | 1/2009 | Raberg et al. |
| 2011/0169488 | A1 | 7/2011 | Mather |
| 2015/0200355 | A1 | 7/2015 | Erie et al. |
| 2016/0260772 | A1* | 9/2016 | Usami ..................... H01L 43/12 |
| 2018/0033955 | A1 | 2/2018 | Wong et al. |
| 2020/0066967 | A1* | 2/2020 | Suri ...................... H01L 27/222 |

FOREIGN PATENT DOCUMENTS

DE   102006010652 A1   9/2007

OTHER PUBLICATIONS

U.S. Non-Final Office Action dated Jun. 13, 2019 for U.S. Appl. No. 15/600,186; 15 Pages.
U.S. Non-Final Office Action dated Jun. 14, 2019 for U.S. Appl. No. 15/991,491; 15 Pages.
U.S. Appl. No. 16/047,342, filed Jul. 27, 2018, Campiglio et al.
International Search Report and Written Opinion of the ISA dated Sep. 26, 2019 for International Application No. PCT/US2019/037629; 13 Pages.
Response to Restriction Requirement filed on Jun. 24, 2020 for U.S. Appl. No. 16/047,342; 1 page.
U.S. Restriction Requirement dated May 8, 2020 for U.S. Appl. No. 16/047,342; 6 Pages.

* cited by examiner

*Primary Examiner* — Steven M Christopher
(74) *Attorney, Agent, or Firm* — Daly Crowley Mofford & Durkee, LLP

(57) ABSTRACT

A manufacturing method results in a magnetoresistance element having conductive contacts disposed between the magnetoresistance element and a semiconductor substrate.

17 Claims, 7 Drawing Sheets

ELECTRONIC CIRCUIT STRUCTURE AND METHOD OF FABRICATING ELECTRONIC CIRCUIT STRUCTURE HAVING MAGNETORESISTANCE ELEMENT WITH IMPROVED ELECTRICAL CONTACTS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic circuit structures and methods of fabricating electronic circuit structures having a magnetoresistance element, and, more particularly, to electronic circuit structures and method of fabricating electronic circuit structures having a magnetoresistance element with improved electrical contacts.

BACKGROUND

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a semiconductor magnetoresistance element such as Indium Antimonide (InSb), a giant magnetoresistance (GMR) element, an anisotropic magnetoresistance element (AMR), and a tunneling magnetoresistance (TMR) element, also called a magnetic tunnel junction (MTJ) element.

Of these magnetoresistance elements, the GMR and the TMR elements operate with spin electronics (i.e., electron spins) where the resistance is related to the magnetic orientation of different magnetic layers separated by nonmagnetic layers. In spin valve configurations, the resistance is related to an angular direction of a magnetization in a so-called "free-layer" relative to a so-called "reference layer."

GMR and TMR elements are known to have a relatively high sensitivity, compared, for example, to Hall effect elements. Thus, a current sensor that uses GMR or TMR elements can sense smaller currents than can a current sensor that uses Hall effect elements.

TMR elements are known to have a higher sensitivity than GMR elements, but at the expense of higher noise at low frequencies.

Magnetoresistance elements are formed as a plurality of specialized layers disposed over a surface of a semiconductor substrate, and in particular, over an oxide or protection layer over a semiconductor substrate. Under the oxide layer can be various semiconducting electronic structures, e.g., transistors, which can be diffused downward into the semiconductor substrate.

Referring to FIGS. 1A-1G, conventional manufacturing steps are generally shown that can result in the conventional magnetoresistance element of FIG. 1G.

Represented in FIG. 1A, a substrate layer 100 (here shown to be only a top layer, e.g., an oxide layer, wherein semiconductor material is below the substrate layer 100) has first and second conductive vias 102a, 102b. The conductive vias can be plugged with a metal, e.g., W (tungsten). In other embodiments, the conductive vias can be coated with a metal, for example, Cu. The first and second conductive vias 102a, 102b can be two individual conductive vias or two groups of conductive vias.

The substrate layer 100 has a surface 100a. The substrate layer 100 can be comprised of an insulating material, e.g., SiO2, under which semiconductor structures may be formed by diffusion techniques or the like.

The surface 100a can be polished, for example, by a CMP (chemical-mechanical polishing or chemical-mechanical planarization) polishing technique. A roughness of the surface can be approximately 0.3 nm (RMS value of surface irregularities) after the polishing. However, top portions of the conductive vias 102a, 102b can have undesirably higher surface roughness, even after the CMP polishing. The undesirable roughness can degrade some characteristics of a magnetoresistance element stack disposed thereupon.

The conductive vias 102a, 102b can extend through the substrate layer 100 down to the semiconductor structures beneath.

A stack of magnetoresistance element layers 104 used to form a magnetoresistance element (once patterned) can be formed over the surface 100a and in electrical communication with the conductive vias 102a, 102b.

Represented in FIG. 1B, a hard layer 106 of hard mask material, e.g., an oxide material, e.g., SiO2, can be formed over the stack of magnetoresistance element layers 104, e.g., by a vapor deposition technique.

Represented in FIG. 1C, a patterned photoresist feature 108 can be formed over the hard layer 106, e.g., by a photolithography technique.

Represented in FIG. 1D, the hard layer 106 can be etched in a pattern of the patterned photoresist feature 108, e.g., by a refractive ion etch (RIE) technique. In some embodiments, this etch can be a timed etch such that the layer 104 is not etched. In other embodiments, this etch can be a selective etch, wherein the layer 104 is covered, for example, with SiN, such that the layer 104 is not etched.

Represented in FIG. 1E, the patterned photoresist feature 108 can be removed, e.g., with a standard chemical process.

Represented in FIG. 1F, the stack of magnetoresistance element layers 104 can be etched in a pattern of the hard layer 106. The pattern can be, from a top view (not shown), a yoke shape, round shape, rectangular shape, or other shape. For this etch, an ion beam etch (IBE) can be used, which is suitable for etching of the different materials of the stack of magnetoresistance element layers 104. The same etch process reduces a thickness of the hard layer 106.

Represented in FIG. 1G, a cap layer 110 can be applied by deposition process to protect the resulting magnetoresistance element 104 having the shape. The cap layer can be comprised of, for example, SiN.

It should be apparent that electrical connections are made between the stack of magnetoresistance element layers 104 and semiconductor structures under the substrate layer 100 by way of only the conductive vias 102a, 102b. For these conventional arrangements, there is no other material between the stack of magnetoresistance element layers 104 and the conductive vias 102a, 102b It is known that some magnetoresistance elements can have an undesirable offset voltage (a resistance indicating non-zero magnetic field when experiencing zero magnetic field). The offset voltage can be different unit-to-unit and can change with temperature. One contributing structure of a magnetoresistance element that can cause variability of the offset voltage is in variability of resistances of the conductive vias 102a, 102b, at a junction to the magnetoresistance element 104.

The conductive vias 102a, 102b can also contribute to other undesirable characteristics of a magnetoresistance element. In this regard, a transfer characteristic between resistance and sensed magnetic field has a slope (sensitivity) that is generally, but not completely, linear within a range of external magnetic fields. Within the linear range, the slope of the transfer characteristic can have nonlinear perturbations (e.g., steps) away from a smooth transfer characteristic. The steps can result from magnetic characteristics of magnetic domains within a so-called free layer in a magnetoresistance element. In turn, the characteristics of the free layer causing the steps can result from irregularities of layers below the free layer, including surface irregularities (i.e., roughness) of the surface 100a. In conventional magnetoresistance elements, the roughness of the surface 100a is made worse by presence of the conductive vias 102a, 102b in direct physical connection to the magnetoresistance element. Irregularities in the surface 100a of the semiconductor substrate can result in crystalline irregularities in layers of the magnetoresistance element 104 above the surface 100a of the semiconductor substrate, including in the free layer.

It would be desirable to provide a magnetoresistance element and techniques to fabricate the magnetoresistance element that can provide a better electrical coupling to a bottom of the magnetoresistance element, which can result in a lower offset voltage of the magnetoresistance element, which can result in less variability of the offset voltage unit-to-unit and with respect to temperature, and which can also result in better crystalline uniformity, with fewer defects, of the magnetoresistance element.

SUMMARY

The present invention provides a magnetoresistance element and techniques to fabricate the magnetoresistance element that can provide a better electrical coupling to a bottom of the magnetoresistance element, which can result in a lower offset voltage of the magnetoresistance element, which can result in less variability of the offset voltage unit-to-unit and with respect to temperature, and which can also result in better crystalline uniformity, with fewer defects, of the magnetoresistance element.

In accordance with an example useful for understanding an aspect of the present invention, a method of fabricating an electronic circuit structure can include one or more of:

providing a semiconductor substrate, a top surface of the semiconductor substrate comprised of a first layer of insulating material, the top surface of the semiconductor substrate comprising first and second conductive vias passing through the top surface of the semiconductor substrate;

polishing the top surface of the semiconductor substrate comprised of the first layer of insulating material;

depositing a layer of conductive material over the top surface of the substrate and in electrical contact with the first and second conductive vias, a top surface of the conductive material distal from the top surface of the semiconductor substrate;

etching the layer of conductive material to generate first and second conductive contacts having a separation parallel to the top surface of the semiconductor substrate, wherein the first conductive contact is in electrical contact with the first conductive via and not with the second conductive via, and wherein the second conductive contact is in electrical contact with the second conductive via and not with the first conductive via; and depositing a magnetoresistance element upon the first and second conductive contacts, the magnetoresistance element having a bottom surface in electrical contact with the first and second conductive contacts and a top surface distal from the first and second conductive contacts, wherein the first conductive contact is disposed between the first conductive via and the magnetoresistance element and the second conductive contact is disposed between the second conductive via and the magnetoresistance element, wherein the first and second conductive vias are operable to pass a current from the first conductive via to the first conductive contact, from the first conductive contact to the magnetoresistance element, through the magnetoresistance element in a direction substantially parallel to the top surface of the substrate, from the magnetoresistance element into the second conductive contact, and from the second conductive contact to the second conductive via.

In accordance with an example useful for understanding another aspect of the present invention, an electronic circuit structure can include one or more of:

a semiconductor substrate, a top surface of the semiconductor substrate comprised of a first layer of insulating material, the top surface of the semiconductor substrate comprising first and second conductive vias passing through the top surface, the top surface of the semiconductor substrate being a polished surface;

first and second conductive contacts having a separation parallel to the top surface of the semiconductor substrate, wherein the first conductive contacts is disposed between the first conductive via and the magnetoresistance element and the second conductive contact is disposed between the second conductive via and the magnetoresistance element, wherein the first conductive contact is in electrical contact with the first conductive via and not with the second conductive via, and wherein the second conductive contact is in electrical contact with the second conductive via and not with the first conductive via; and a magnetoresistance element disposed upon the first and second conductive contacts, the magnetoresistance element having a bottom surface in electrical contact with the first and second conductive contacts and a top surface distal from the first and second conductive contacts, wherein the first and second conductive vias are operable to pass a current from the first conductive via to the first conductive contact, from the first conductive contact to the magnetoresistance element, through the magnetoresistance element in a direction substantially parallel to the top surface of the substrate, from the magnetoresistance element into the second conductive contact, and from the second conductive contact to the second conductive via.

In accordance with an example useful for understanding another aspect of the present invention, method of fabricating an electronic circuit structure, can include:

providing a semiconductor substrate having first and second conductive vias;

creating first and second conductive contacts in electrical contact with the first and second conductive vias; and depositing a magnetoresistance element over and in electrical contact with the first and second conductive contacts.

In accordance with an example useful for understanding another aspect of the present invention, an electronic circuit structure can include:

a semiconductor substrate having first and second conductive vias;

first and second conductive contacts disposed over and in electrical contact with the first and second conductive vias; and depositing a magnetoresistance element over and in electrical contact with the first and second conductive contacts.

BRIEF DESCRIPTION OF THE DRAWINGS

The foregoing features of the invention, as well as the invention itself may be more fully understood from the following detailed description of the drawings, in which.

DETAILED DESCRIPTION

Figure 1A:
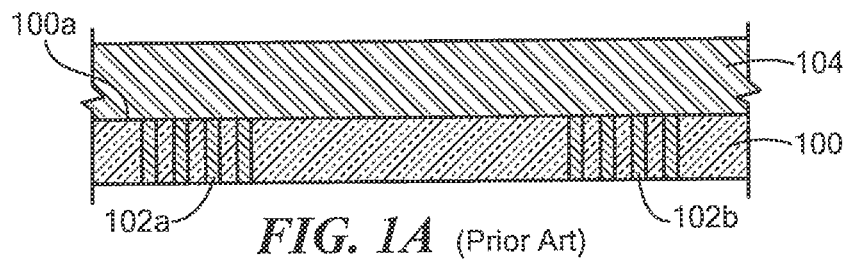
FIGS. 1A-1G are block diagrams representative of fabrication steps that can be used to fabricate a conventional magnetoresistance element.
Figure 1B:
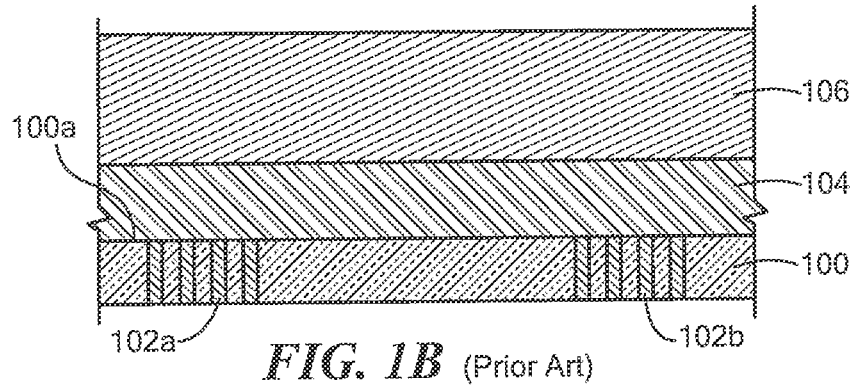
Figure 1C:
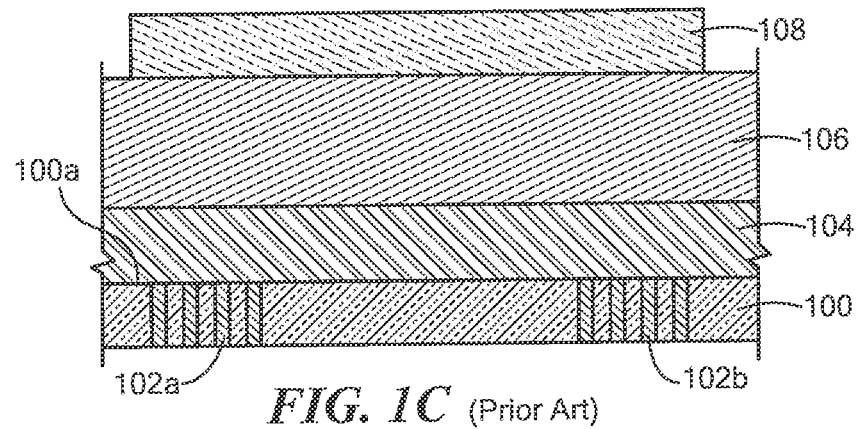
Figure 1D:
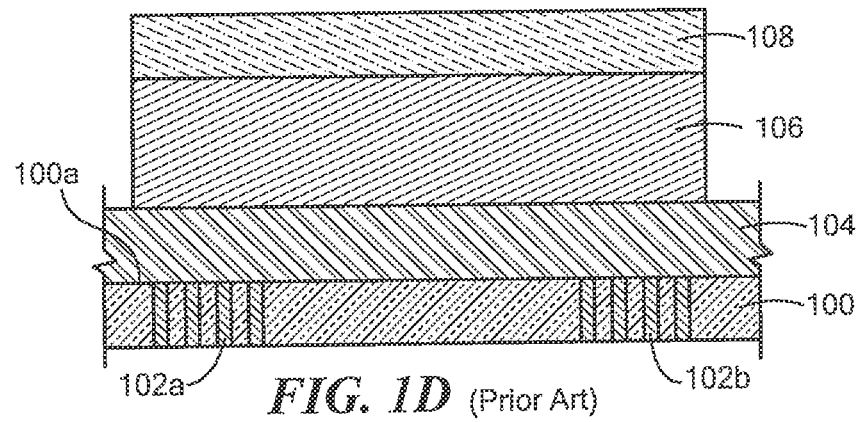

Before describing the present invention, it should be noted that reference is sometimes made herein to GMR or TMR elements having particular shapes (e.g., yoke shaped or pillar shaped). One of ordinary skill in the art will appreciate, however, that the techniques described herein are applicable to a variety of sizes and shapes.

As used herein, the term "anisotropy" or "anisotropic" refer to a material that has different properties according to direction in the material. A magnetoresistance element can have a particular axis or direction to which the magnetization of a ferromagnetic or ferrimagnetic layer tends to orientate when it does not experience an additional, external, magnetic field. An axial anisotropy can be created by a crystalline effect or by a shape anisotropy, both of which can allow two equivalent directions of magnetic fields. A directional anisotropy can also be created in an adjacent layer, for example, by an antiferromagnetic layer, which allows only a single magnetic field direction along a specific axis in the adjacent layer.

In view of the above, it will be understood that introduction of an anisotropy in a magnetic layer results in forcing the magnetization of the magnetic layer to be parallel to that anisotropy in the absence of an external field. In the case of a GMR or TMR element, a directional anisotropy provides an ability to obtain a coherent rotation of the magnetization in a magnetic layer in response, for example, to an external magnetic field, which has the property of suppressing the hysteresis behavior of the corresponding element.

As is known, there are different types of magnetoresistance elements, for example, a semiconductor magnetoresistance element such as Indium Antimonide (InSb), a giant magnetoresistance (GMR) element, an anisotropic magnetoresistance element (AMR), and a tunneling magnetoresistance (TMR) element, also called a magnetic tunnel junction (MTJ) element.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

The terms "parallel" and "perpendicular" may be used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the terms "substantially" and the term "about" reflect angles that are within manufacturing tolerances, for example, within +/− ten degrees.

Structures and methods described herein apply to GMR, TMR, and AMR magnetoresistance elements, and any other types of magnetoresistance elements. However, it should be appreciated that the same or similar structures and methods can apply to other magnetoresistance elements, either now known or later discovered.

Figure 2A:
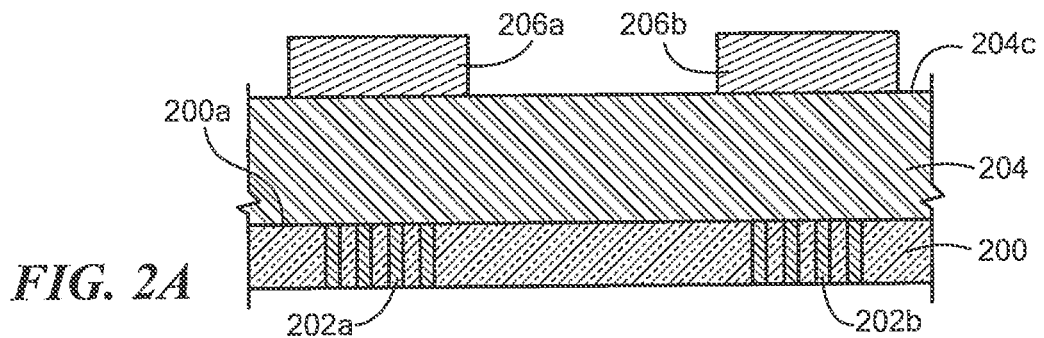
FIGS. 2A-2G are block diagrams representative of other fabrication steps that can be used to fabricate another magnetoresistance element.
Figure 2B:
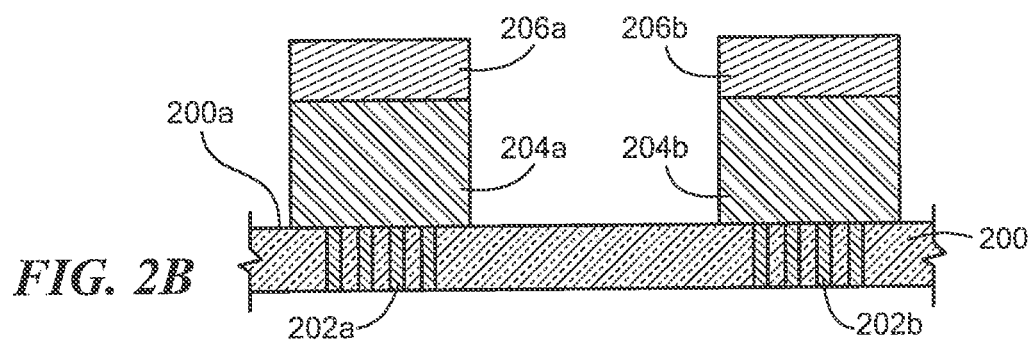
Figure 2C:
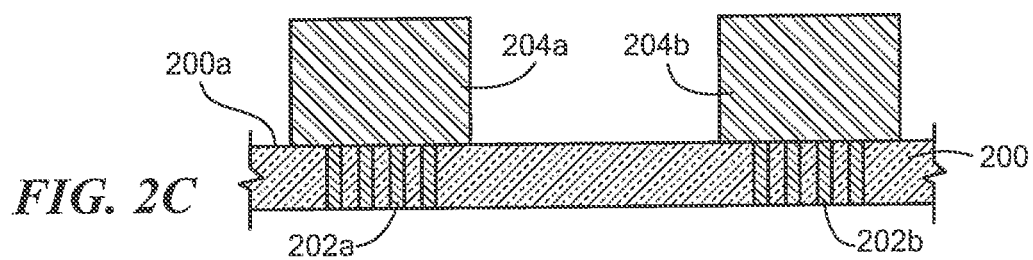
Figure 2D:
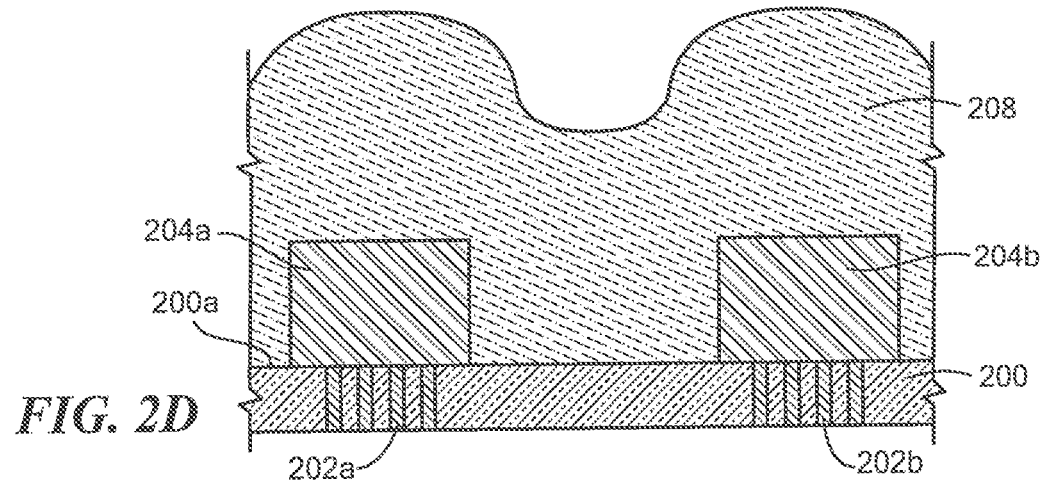
Figure 2E:
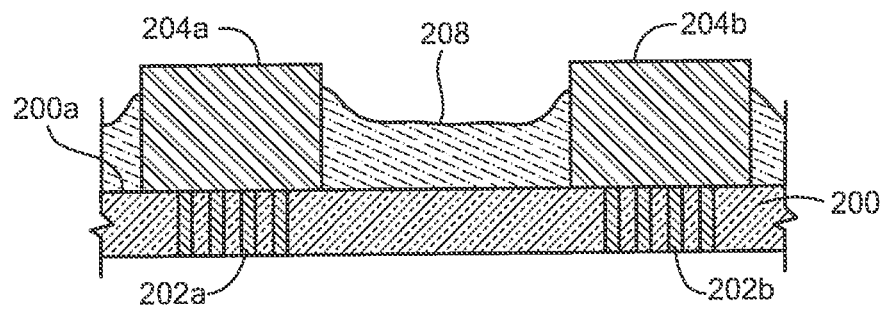
Figure 2F:
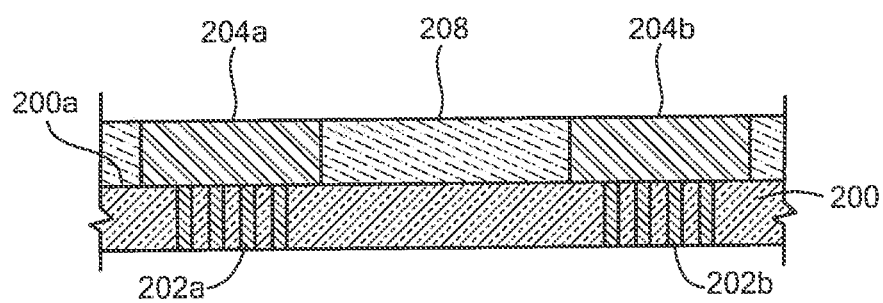
Figure 2G:
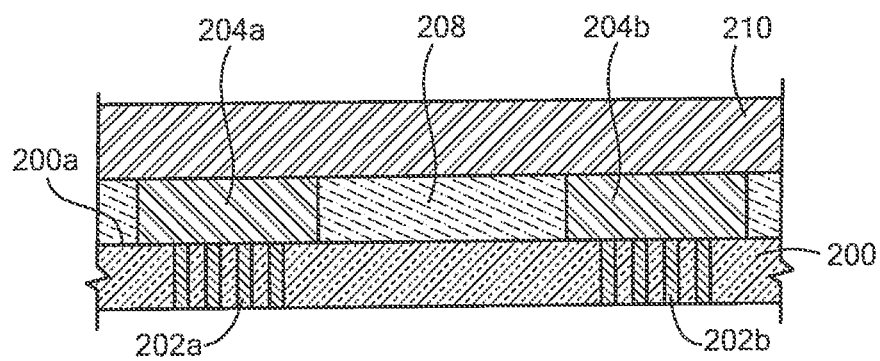

Referring now to FIGS. 2A-2G, manufacturing steps are generally shown that can result in the magnetoresistance element of FIG. 2G. Steps recited below can be performed in other orders.

Represented in FIG. 2A, a substrate layer 200 (here shown to be only a top layer, e.g., an oxide layer, wherein the semiconductor material is below the substrate layer 200) has conductive vias 202a, 202b. In some embodiments, the conductive vias can be plugged with a metal, e.g., W (Tungsten). In other embodiments, the conductive vias can be coated with a metal, for example, Cu. The conductive vias 202a, 202b can be two individual conductive vias or two groups of plugged vias.

The substrate layer 200 has a surface 200a. The substrate layer 200a can be comprised of a nonconducting material, e.g., SiO2, under which semiconductor structures may be formed by diffusion techniques or the like.

The surface 200a can be polished, for example, by a CMP (chemical-mechanical polishing or chemical-mechanical planarization) polishing technique. A roughness of the surface can be approximately 0.3 nm (RMS value of surface irregularities) after the polishing. However, top portions of the conductive vias 202a, 202b can have undesirably higher surface roughness, even after the CMP polishing.

The conductive vias 202a, 202b can extend through the substrate layer 200 down to the semiconductor structures beneath.

A conductive layer 204 can be formed over the surface 200a and in electrical communication with the conductive vias. The conductive layer 204 can be comprised of a metal, e.g., TiN. The conductive layer 204 can be formed, for example, by a sputtering technique.

It will become apparent from discussion below, that a magnetoresistance element is in contact with the conductive layer, and is not in direct contact with the conductive vias 202a, 202b.

In some embodiments, a top surface 204c of the conductive layer 204 can be polished, for example, with a CMP process. However, it is described in conjunction with FIG. 2F below that polishing of the conductive layer 204 can be performed at a later step.

Patterned photoresist features 206a, 206b can be formed over the conductive layer 204, for example, with a photolithography process.

Represented in FIG. 2B, the conductive layer 204 can be etched to form first and second conductive layer portions 204a, 204b. A chemical etch can be used. The first conductive layer portion 204a can be electrically coupled to the conductive vias 202a and the second conductive layer portion 204b can be electrically coupled to the conductive vias 202a. The first conductive layer portion 204a is not directly electrically coupled to the second conductive layer portion 204b.

Represented in FIG. 2C, the patterned photoresist features 206a, 206b can be removed, e.g., by a standard chemical process.

Represented in FIG. 2D, an insulator layer 208 can be formed over the surface 200a of the substrate layer 200, and over and between the first and second conductive layer portions 204a, 204b. The insulator layer 208, for example, can be comprised of SiO2 and formed by a vapor deposition technique.

Represented in FIG. 2E, the insulator layer 208 can be etched down to a level still above the surface 200a. This etching can be achieved, for example, by a refractive ion etch (RIE) technique.

Represented in FIG. 2F, the insulator layer 208 and the first and second conductive layer portions 206a, 206b can be polished and planarized, for example, using a CMP technique. The CMP technique can result in a top surface of the insulator layer 208 and top surfaces of the first and second conductive layer portions 204a, 204b having a surface roughness of about 5 nm.

For this arrangement, the polishing of the conductive layer 204 described above in conjunction with FIG. 2A can be omitted, since the conductive layer 204 is polished here as represented in FIG. 2F.

In some alternate embodiments, the etch represented in FIG. 2E and the planarization represented in FIG. 2F can be reversed in order such that the polishing precedes the etch. In these embodiments, the polishing does not expose or polish top surfaces of the first and second conductive layer portions 206a, 206b, and exposure is achieved with the following etch. For these embodiments, the conductive surface 208 is polished at an earlier step, for example, as described above in conjunction with FIG. 2A.

Represented in FIG. 2G, a stack of magnetoresistance element layers 210 can be deposited over the insulator layer 208 and over the first and second conductive layer portions 204a, 204b.

Figure 1E:
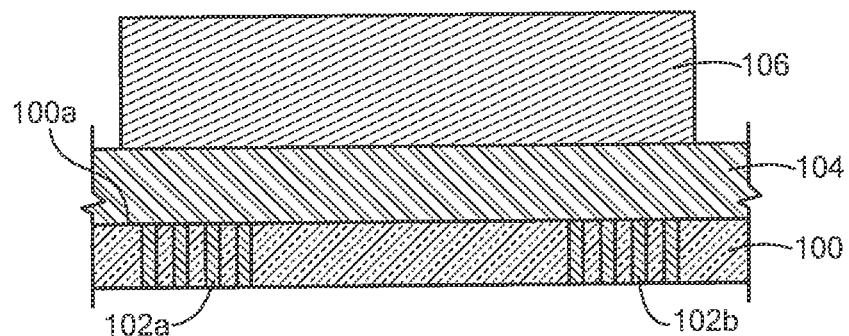
Figure 1F:
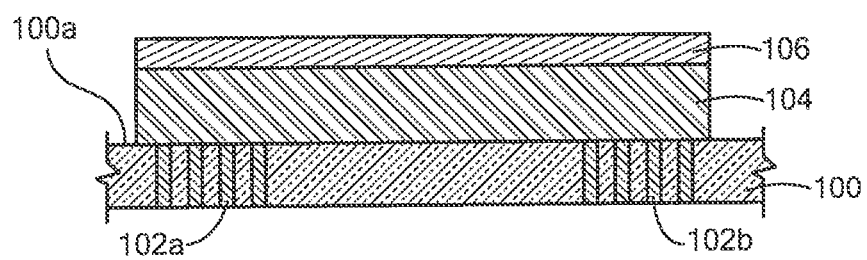

After deposition, the stack of magnetoresistance element layers 210 can be etched in a pattern to form a magnetoresistance element. Patterning of the stack of magnetoresistance element layers 210 can be performed with techniques described above in conjunction with FIGS. 1E-1G. The pattern can be, from a top view (not shown), a yoke shape, round shape, rectangular shape, or another shape. For this etch, an ion beam etch (IBE) can be used.

Figure 1G:
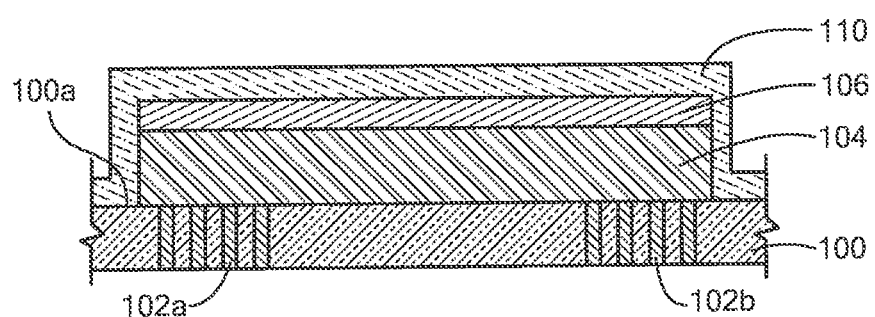

A cap layer (not shown) similar to the cap layer 110 of FIG. 1G can be applied by deposition process to protect the resulting magnetoresistance element 210 having the shape. The cap layer can be comprised of, for example, SiN.

It should be apparent that electrical connections are made between the magnetoresistance element and semiconductor structures under the substrate layer 200 by way of the conductive vias 202a, 202b and by way of the first and second conductive layer portions 204a, 204b.

Top surfaces of the first and second conductive layer portions 204a, 204b can be smoother than is the top surface 200a of the substrate layer 200, particularly proximate to the conductive vias 202a, 202b. Thus, irregularities in crystal structure of layers of the magnetoresistance element 210 are reduced. Also, resistances through the conductive vias 202a, 202b, through the first and second conductive layer portions 204a, 204b, to the magnetoresistance element 210 can be less than resistances through the conductive vias 102a, 102b to the magnetoresistance element 104 of FIG. 1G, resulting in a lower offset voltage and less variation of the offset voltage unit-to-unit and with respect to temperature.

Figure 3A:
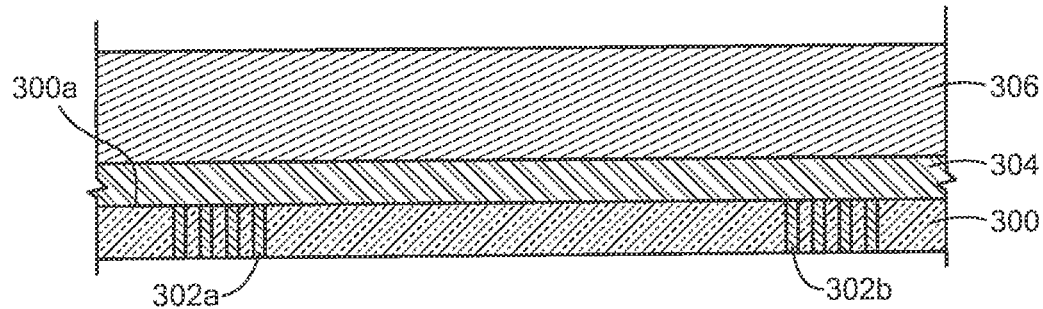
FIGS. 3A-3G are block diagrams representative of other fabrication steps that can be used to fabricate another magnetoresistance element.
Figure 3B:
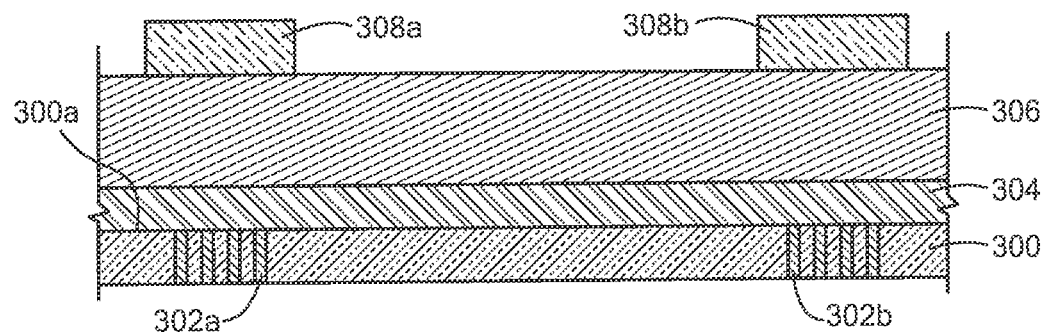
Figure 3C:
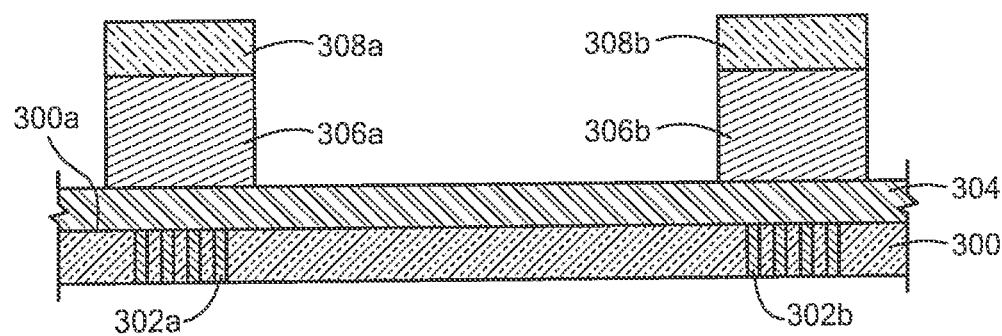
Figure 3D:
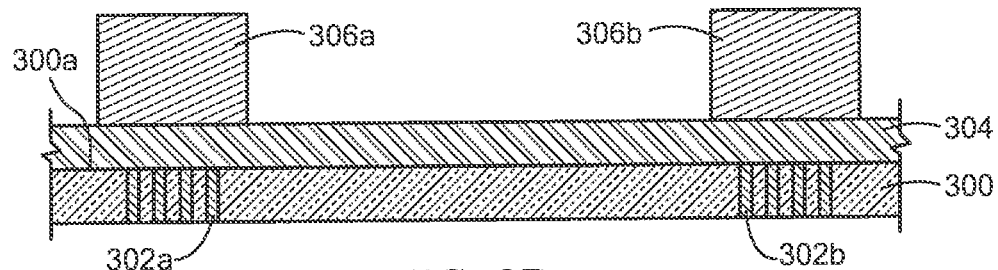
Figure 3E:
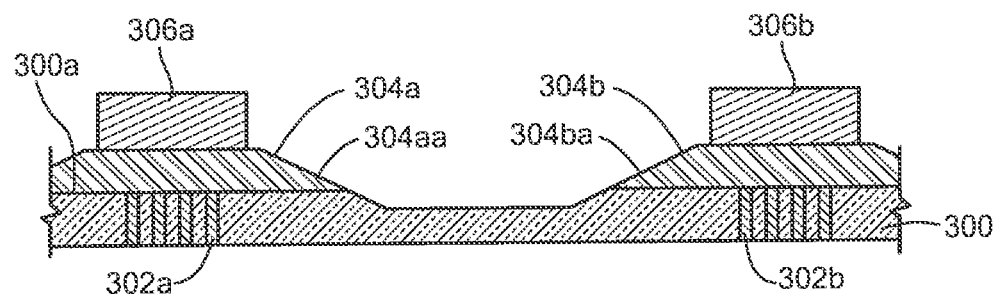
Figure 3F:
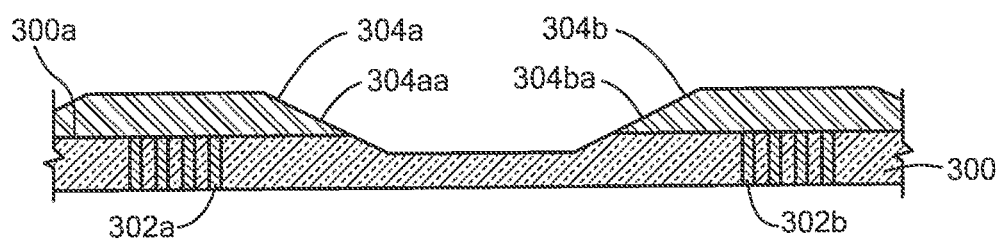
Figure 3G:
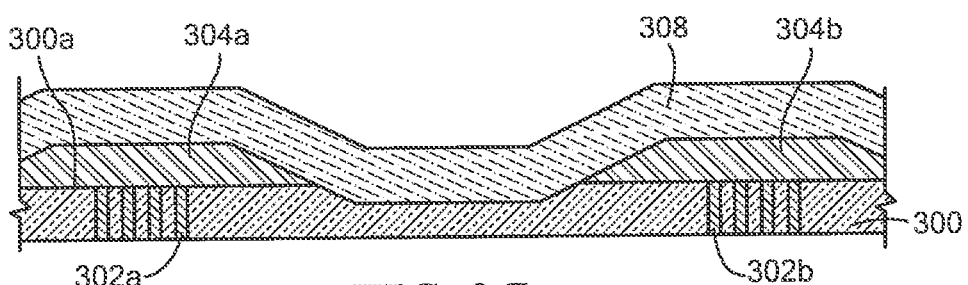

Referring now to FIGS. 3A-3G, manufacturing steps are generally shown that can result in the magnetoresistance element of FIG. 3G. Steps recited below can be performed in other orders.

Represented in FIG. 3A, a substrate layer 300 (here shown to be only a top layer, e.g., an oxide layer, wherein the semiconductor material is below the substrate layer 300) has conductive vias 302a, 302b. In some embodiments, the conductive vias can be plugged with a metal, e.g., W (Tungsten) In other embodiments, the conductive vias can be coated with a metal, for example, Cu. The conductive vias 202a, 202b can be two individual conductive vias or two groups of plugged vias.

The substrate layer 300 has a surface 300a. The substrate layer can be comprised of, an insulating material, e.g., SiO2, under which semiconductor structures may be formed by diffusion techniques or the like. The surface 300a can be polished, for example, by a CMP (chemical-mechanical polishing or chemical-mechanical planarization) polishing technique. A roughness of the surface can be approximately 0.3 nm (RMS value of surface irregularities) after the polishing. However, top portions of the conductive vias 302a, 302b can have undesirably higher surface roughness, even after the CMP polishing.

The conductive vias 302a, 302b can extend through the substrate layer 300 down to the semiconductor structures beneath.

A conductive layer 304 can be formed over the surface 300a and in electrical communication with the conductive vias. The conductive layer 304 can be comprised of a metal, e.g., TiN. The conductive layer can be formed, for example, by a sputtering technique.

The conductive layer 304 can be polished and planarized, for example, with a CMP technique.

A hard layer 306 can be formed over the conductive layer 304. The hard layer can be comprised of an insulating material, e.g., SiO2, for example, by a vapor deposition technique.

Represented in FIG. 3B, patterned photoresist features 308a, 308b can be formed over the hard layer 306, for example, with a photolithography process.

Represented in FIG. 3C, the hard layer 306 can be etched to form first and second hard layer portions 306a, 306b. The etching can be performed, for example, with a reactive ion etch (RIE) technique, a chemical etch, resulting in sharp edges of the etched features.

Represented in FIG. 3D, the patterned photoresist feature 308a, 308b can be removed, for example, by a chemical process.

Represented in FIG. 3E, the conductive layer 304 can be etched to form first and second conductive layer portion 304a, 304b. The first conductive layer portion 304a can be electrically coupled to the conductive vias 302a and second conductive layer portion 304b can be electrically coupled to the conductive vias 302a. The first conductive layer portion 304a is not directly electrically coupled to the second conductive layer portion 304b.

Edges 304aa, 304ba can be sloped to an angle of less than about sixty degrees relative to the surface 300a of the substrate layer 300. To achieve the slope, in some embodiments, an ion beam etching (IBE) process can be used. However, to achieve the slope, other physical etching techniques, as opposed to chemical etching techniques, can be used.

Represented in FIG. 3F, the first and second hard layer portions 306a, 306b can be removed by etching. This etching can be achieved, for example, by a refractive ion etch (RIE) technique.

Represented in FIG. 3G, a stack of magnetoresistance element layers 308 can be deposited over the first and second conductive layer portions 304a, 304b, including over the sloped edges 304aa, 304ba of the conductive layer portions 304a, 304b.

After deposition, the stack of magnetoresistance element layers 308 can be etched in a pattern. Patterning of the stack of magnetoresistance element layers 308 can be performed with techniques described above in conjunction with FIGS. 1E-1G. The pattern can be, from a top view (not shown), a yoke shape, round shape, rectangular shape, or other shape. For this etch, an ion beam etch (IBE) can be used.

A cap layer (not shown) similar to the cap layer 110 of FIG. 1G can be applied by deposition process to protect the resulting magnetoresistance element 308 having the shape. The cap layer can be comprised of, for example, SiN.

It should be apparent that electrical connections are made between the magnetoresistance element and semiconductor structures under the substrate layer 300 by way of the conductive vias 302a, 302b and by way of the first and second conductive layer portions 304a, 304b.

Top surfaces of the first and second conductive layer portions 304a, 304b, including the edges 304aa, 304ba, can be smoother than is the top surface 300a of the substrate layer 300, particularly proximate to the conductive vias 302a, 302b. Thus, irregularities in crystal structure of layers of the magnetoresistance element 308 are reduced. Also, resistances through the conductive vias 302a, 302b, through the first and second conductive layer portions 304a, 304b, to the magnetoresistance element 308 can be less than resistances through the conductive vias 102a, 102b to the magnetoresistance element 104 of FIG. 1G, resulting in a lower offset voltage and less variation of the offset voltage unit-to-unit and with respect to temperature.

Figure 4A:
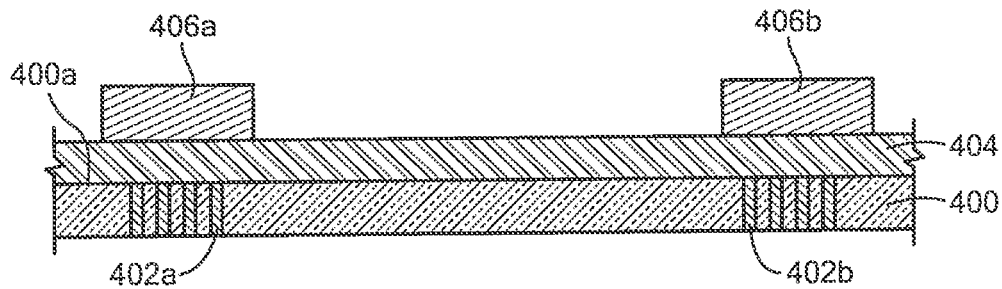
FIGS. 4A-4D are block diagrams representative of other fabrication steps that can be used to fabricate another magnetoresistance element.
Figure 4B:
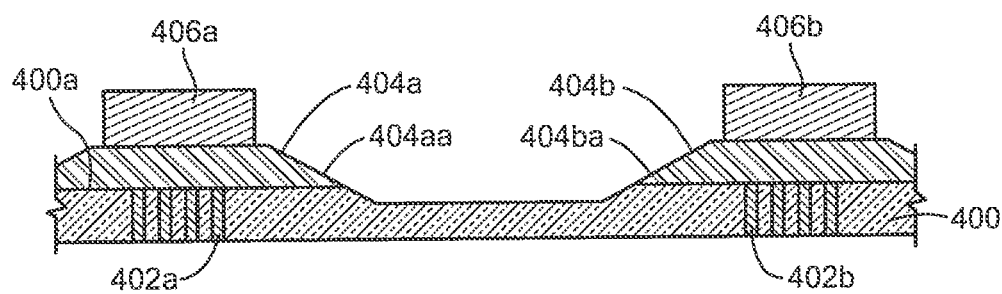
Figure 4C:
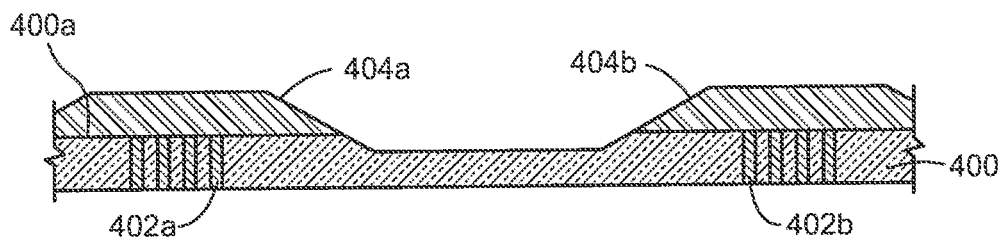
Figure 4D:
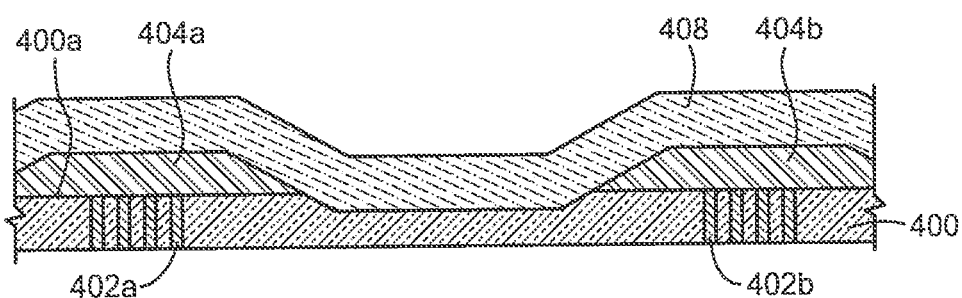

Referring now to FIGS. 4A-4D, manufacturing steps are generally shown that can result in the magnetoresistance element of FIG. 4D. Steps recited below can be performed in other orders.

Represented in FIG. 4A, a substrate layer 400 (here shown to be only a top layer, e.g., an oxide layer, the semiconductor would otherwise be below the substrate layer 400) has conductive vias 402a, 402b, conductive with a metal, e.g., SiO2 or SiN. The conductive vias 402a, 402b can be two individual conductive vias or two groups of conductive vias.

The substrate layer 400 has a surface 400a and can be comprised of an insulating material, e.g., SiO2, under which semiconductor structures may be formed by diffusion techniques or the like. The surface 400a can be polished, for example, by a CMP (chemical-mechanical polishing or chemical-mechanical planarization) polishing technique. A roughness of the surface can be approximately 0.3 nm (RMS value of surface irregularities) after the polishing. However, top portions of the conductive vias 402a, 402b can have undesirably higher surface roughness, even after the CMP polishing.

The conductive vias 402a, 402b can extend through the substrate layer 400 down to the semiconductor structures beneath.

A conductive layer 404 can be formed over the surface 400a and in electrical communication with the conductive vias. The conductive layer 404 can be comprised of a metal, e.g., TiN. The conductive layer can be formed, for example, by a sputtering technique.

The conductive layer 404 can be polished and planarized, for example, with a CMP technique.

Patterned photoresist features 406a, 406b can be formed over the conductive layer 404, for example, with a photolithography process.

Represented in FIG. 4B, the conductive layer 404 can be etched to form first and second conductive layer portion 404a, 404b. The first conductive layer portion 404a can be electrically coupled to the conductive vias 402a and the second conductive layer portion 404b can be electrically coupled to the conductive vias 402a. The first conductive layer portion 404a is not directly electrically coupled to the second conductive layer portion 404b.

Edges 404aa, 404ba can be sloped to an angle of less than about sixty degrees relative to the surface 400a of the substrate layer 400. To achieve the slope, an ion beam etching (IBE) process can be used. However, other physical etching techniques, as opposed to chemical etching techniques, can also be used.

Represented in FIG. 4C, the patterned photoresist features 406a, 406b can be removed by a chemical process.

Represented in FIG. 4D, a stack of magnetoresistance element layers 408 can be deposited over the first and second conductive layer portions 404a, 404b, including over the sloped edges 404aa, 404ba.

After deposition, the stack of magnetoresistance element layers 408 can be etched in a pattern. Patterning of the stack of magnetoresistance element layers 408 can be performed with techniques described above in conjunction with FIGS. 1E-1G. The pattern can be, from a top view (not shown), a yoke shape, round shape, rectangular shape, or other shape. For this etch, an ion beam etch (IBE) can be used.

A cap layer (not shown) similar to the cap layer 110 of FIG. 1G can be applied by deposition process to protect the resulting magnetoresistance element 408 having the shape. The cap layer can be comprised of, for example, SiN.

It should be apparent that electrical connections are made between the magnetoresistance element and semiconductor structures under the substrate layer 400 by way of the conductive vias 402a, 402b and by way of the first and second conductive layer portions 404a, 404b.

Top surfaces of the first and second conductive layer portions 404a, 404b, including the edges 404aa, 404ba, can be smoother than is the top surface 400a of the substrate layer 400, particularly proximate to the conductive vias 402a, 402b. Thus, irregularities in crystal structure of layers of the magnetoresistance element 408 are reduced. Also, resistances through the conductive vias 402a, 402b, through the first and second conductive layer portions 404a, 404b, to the magnetoresistance element 408 can be less than resistances through the conductive vias 102a, 102b to the magnetoresistance element 104 of FIG. 1G, resulting in a lower offset voltage and less variation of the offset voltage unit-to-unit and with respect to temperature.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method of fabricating an electronic circuit structure, comprising
    providing a semiconductor substrate, a top surface of the semiconductor substrate comprised of a first layer of insulating material, the top surface of the semiconductor substrate comprising first and second conductive vias passing through the top surface of the semiconductor substrate;
    polishing the top surface of the semiconductor substrate comprised of the first layer of insulating material;
    depositing a layer of conductive material over the top surface of the substrate and in electrical contact with the first and second conductive vias, a top surface of the conductive material distal from the top surface of the semiconductor substrate;
    depositing a second layer of insulating material over the layer of conductive material, a top surface of the second layer of insulating material distal from the top surface of the semiconductor substrate comprised of the first layer of insulating material;
    etching the layer of conductive material to generate first and second conductive contacts having a separation parallel to the top surface of the semiconductor substrate, wherein the first conductive contact is in electrical contact with the first conductive via and not with the second conductive via, and wherein the second conductive contact is in electrical contact with the second conductive via and not with the conductive first via; and
    depositing a magnetoresistance element upon the first and second conductive contacts, the magnetoresistance element having a bottom surface in electrical contact with the first and second conductive contacts and a top surface distal from the first and second conductive contacts, wherein the first conductive contact is disposed between the first conductive via and the magnetoresistance element and the second conductive contact is disposed between the second conductive via and the magnetoresistance element, wherein the first and second conductive vias are operable to pass a current from the first conductive via to the first conductive contact, from the first conductive contact to the magnetoresistance element, through the magnetoresistance element in a direction substantially parallel to the top surface of the substrate, from the magnetoresistance element into the second conductive contact, and from the second conductive contact to the second conductive via.

2. The method of claim 1, further comprising:
    polishing the top surface of the second layer of insulating material.

3. The method of claim 2, further comprising:
    etching the top surface of the second layer of insulating material until top surfaces of the first and second conductive contacts are exposed.

4. The method of claim 3, wherein the depositing the magnetoresistance element over the first and second conductive contacts includes depositing the magnetoresistance element over the etched top surface of the second layer of insulating material.

5. The method of claim 1, further comprising:
    etching the top surface of the second layer of insulating material until top surfaces of the first and second conductive contacts are exposed.

6. The method of claim 5, wherein the depositing the magnetoresistance element over the first and second conductive contacts includes depositing the magnetoresistance element over the etched top surface of the second layer of insulating material.

7. The method of claim 5, further comprising:
    polishing the top surface of the second layer of insulating material.

8. The method of claim 7, wherein the depositing the magnetoresistance element over the first and second conductive contacts includes depositing the magnetoresistance element over the polished top surface of the second layer of insulating material.

9. The method of claim 2, wherein the depositing the magnetoresistance element over the first and second conductive contacts includes depositing the magnetoresistance element over the polished top surface of the second layer of insulating material.

10. The method of claim 1, further comprising:
    before the etching the layer of conductive material to generate the first and second conductive contacts, polishing the top surface of the layer of conductive material.

11. The method of claim 1, further comprising:
    etching the second layer of insulating material to expose the top surface of the layer of conductive material.

12. The method of claim 11, wherein the etching the layer of conductive material to generate first and second conductive contacts results in respective proximate edges of the first and second conductive contacts being sloped less than sixty degrees relative to the top surface of the semiconductor substrate.

13. The method of claim 12, wherein the depositing the magnetoresistance element over the first and second conductive contacts includes depositing the magnetoresistance element over the sloped proximate edges.

14. The method of claim 1, further comprising:
    before the etching the layer of conductive material to generate the first and second conductive contacts, polishing the top surface of the layer of conductive material, wherein the etching the layer of conductive material to generate first and second conductive contacts results in respective proximate edges of the first and second conductive contacts being sloped less than sixty degrees relative to the top surface of the semiconductor substrate.

15. The method of claim 14, wherein the depositing the magnetoresistance element over the first and second conductive contacts includes depositing the magnetoresistance element over the sloped proximate edges.

16. A method of fabricating an electronic circuit structure, comprising;
    providing a semiconductor substrate having first and second conductive vias;

creating first and second conductive contacts in electrical contact with the first and second conductive vias;

depositing a layer of conductive material over the top surface of the substrate and in electrical contact with the first and second conductive vias, a top surface of the conductive material distal from the top surface of the semiconductor substrate;

depositing a second layer of insulating material over the layer of conductive material, a top surface of the second layer of insulating material distal from the top surface of the semiconductor substrate comprised of the first layer of insulating material; and depositing a magnetoresistance element over and in electrical contact with the first and second conductive contacts.

17. The method of claim 16, further comprising:

polishing or etching a top surface of the layer of insulating material.

* * * * *